United States Patent
Sasaki

(10) Patent No.: US 7,178,332 B2
(45) Date of Patent: Feb. 20, 2007

(54) EXHAUST HEAT RECOVERY SYSTEM

(75) Inventor: Toshitake Sasaki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 11/075,940

(22) Filed: Mar. 10, 2005

(65) Prior Publication Data

US 2005/0204733 A1 Sep. 22, 2005

(30) Foreign Application Priority Data

Mar. 22, 2004 (JP) ............................. 2004-083049

(51) Int. Cl.
*F01N 3/02* (2006.01)
(52) U.S. Cl. .................. 60/320; 60/274; 60/275; 60/287; 60/292; 422/109; 422/199; 422/200; 136/205; 136/211; 136/236.1
(58) Field of Classification Search .................. 60/274, 60/275, 287, 288, 291, 292, 320, 324; 422/109, 422/110, 199, 200, 201, 202, 171, 173; 136/201, 136/205, 211, 212, 236.1
See application file for complete search history.

(56) References Cited

U.S. PATENT DOCUMENTS 4,753,682 A * 6/1988 Cantoni ..................... 136/212
5,968,456 A * 10/1999 Parise ......................... 422/174
6,172,427 B1 * 1/2001 Shinohara et al. ......... 290/40 B
6,986,247 B1 * 1/2006 Parise ........................... 60/284

FOREIGN PATENT DOCUMENTS

| JP | 407012009 A * | 1/1995 | .................. 60/320 |
| JP | 2003-65045 | 3/2003 | |
| JP | 02005223132 A * | 8/2005 | .................. 60/320 |
| WO | WO 2004/059138 A1 | 7/2004 | |
| WO | WO 2004/059139 A1 | 7/2004 | |

* cited by examiner

*Primary Examiner*—Binh Q. Tran
(74) *Attorney, Agent, or Firm*—Finnegan, Henderson, Farabow, Garrett & Dunner, LLP.

(57) ABSTRACT

In an exhaust heat recovery system, electric power generation efficiency of a thermoelectric conversion element can be improved, and warming-up of a catalyst can be completed early, without using a complicated device. The exhaust heat recovery system according to the invention includes an exhaust pipe in which exhaust gas discharged from an internal combustion engine flows; a catalyst which purifies the exhaust gas; a heat recovery portion which is fitted to the exhaust pipe, and which recovers heat contained in the exhaust gas; a thermoelectric conversion element which generates electric power using thermoelectric conversion; and a heat pipe which connects the heat recovery portion to the thermoelectric conversion element, and which transfers the heat recovered in the heat recovery portion to the thermoelectric conversion element. An operation starting temperature of the heat pipe is set so as to be higher than an activation temperature of the catalyst.

9 Claims, 10 Drawing Sheets

EXHAUST HEAT RECOVERY SYSTEM

INCORPORATION BY REFERENCE

The disclosure of Japanese Patent Application No. 2004-083049 filed on Mar. 22, 2004, including the specification, drawings and abstract is incorporated herein by reference in its entirety.

BACKGROUND OF THE INVENTION

1. Field of the Invention

The invention relates to an exhaust heat recovery system which is used in an automobile such as a hybrid vehicle, and which recovers heat energy contained in gas so as to convert the heat energy contained in the gas to electric energy.

2. Description of the Related Art

Heat energy is contained in exhaust gas, and the like, that is discharged from an engine of an automobile. Accordingly, if the exhaust gas is simply discharged, the energy is wasted. To address this concern, technologies have been developed that utilize an exhaust heat recovery system to recover the heat energy contained in exhaust gas, and convert it to electric energy using a thermoelectric conversion element. The converted electric energy can then be used, for example, to recharge a battery.

An example of such an exhaust heat recovery system is disclosed in Japanese Patent Laid-Open Publication No. 2003-65045. In the exhaust heat recovery system, a heat pipe is connected to a component of an exhaust system for an engine, and a thermoelectric element (thermoelectric conversion element) is connected to the heat pipe. Also, a catalyst for purifying exhaust gas is provided in the exhaust system for the engine. Thus, since heat in the exhaust system is transferred to the thermoelectric element using the heat pipe, electric power generation efficiency of the thermoelectric element is improved, and efficiency of recovering engine exhaust heat is improved.

Meanwhile, the catalyst provided in the exhaust system for the engine offers intrinsic purification performance when a temperature of the catalyst reaches an activation temperature at which the catalyst is activated. Accordingly, when the catalyst is cold, for example, when then engine is started, the purification performance of the catalyst can be obtained early by completing warming-up of the catalyst early.

However, in the exhaust heat recovery system disclosed in the Japanese Patent Laid-Open Publication No. 2003-65045, since the heat contained in exhaust gas is transferred to the thermoelectric conversion element using the heat pipe, an amount of heat contained in the exhaust gas transported to the catalyst is decreased. Therefore, there is a problem that it takes a long time to complete warming-up of the catalyst.

In order to solve the problem, for example, it is conceivable to perform ON-OFF control of the thermoelectric element such that the thermoelectric element is turned off when warming-up of the catalyst is performed. However, in order to perform such ON-OFF control of the thermoelectric element, it is necessary to provide a control device, On-Off switching means, a temperature sensor for detecting a temperature of the catalyst, and the like. Therefore, there is a problem that configuration of the exhaust heat recovery system becomes complicated, and size thereof is increased.

SUMMARY OF THE INVENTION

It is an object of the invention to provide an exhaust heat recovery system having a simple configuration, in which electric power generation efficiency of a thermoelectric conversion element can be improved, and warming-up of the catalyst can be completed early, without using a complicated device.

In order to solve the aforementioned problem, an exhaust heat recovery system according to each of the following first to fourth aspects of the invention is provided.

According to a first aspect of the invention, an exhaust heat recovery system includes an exhaust pipe in which exhaust gas discharged from an internal combustion engine flows; a catalyst which purifies the exhaust gas; a heat recovery portion which is fitted to the exhaust pipe, and which recovers heat contained in the exhaust gas; a thermoelectric conversion element which generates electric power using thermoelectric conversion; and a heat pipe which connects the heat recovery portion to the thermoelectric conversion element, and which transfers the heat recovered in the heat recovery portion to the thermoelectric conversion element. In the exhaust heat recovery system, an operation starting temperature of the heat pipe is set so as to be higher than an activation temperature of the catalyst.

With the aforementioned configuration, since the heat recovered from the exhaust gas in the heat recovery portion is transported to the thermoelectric conversion element through the heat pipe, it is possible to improve the electric power generation efficiency of the thermoelectric conversion element. Also, since the operation starting temperature of the heat pipe is set so as to be higher than the activation temperature of the catalyst, when the temperature of the exhaust gas is equal to or lower than the activation temperature of the catalyst, the heat contained in the exhaust gas is transferred to the catalyst. Accordingly, warming-up of the catalyst can be completed early. Also, it is not necessary to provide a control device, ON-OFF switching means, or a temperature sensor for detecting the temperature of the catalyst. Accordingly, it is possible to simplify the configuration of the exhaust heat recovery system.

In this case, the exhaust heat recovery system may further include a second heat pipe which connects the heat recovery portion to the catalyst, and which transfers the heat recovered in the heat recovery portion to the catalyst, and an operation starting temperature of the second heat pipe may be set so as to be equal to or lower than an activation temperature of the catalyst.

With the aforementioned configuration, since the heat contained in the exhaust gas can be transported to the catalyst when the temperature of the exhaust gas is equal to or lower than the activation temperature of the catalyst, warming-up of the catalyst can be completed early.

According to a second aspect of the invention, an exhaust heat recovery system includes a thermoelectric conversion element which generates electric power using thermoelectric conversion; a catalyst which purifies exhaust gas discharged from an internal combustion engine; and a heat pipe which connects the catalyst to the thermoelectric conversion element, and which transfers heat recovered in the catalyst to the thermoelectric conversion element. In the exhaust heat recovery system, an operation starting temperature of the heat pipe is set so as to be substantially equal to an activation temperature of the catalyst.

With the aforementioned configuration, the heat contained in the exhaust gas is transferred to the catalyst until the temperature of the catalyst reaches the activation temperature. After the temperature of the catalyst reaches the activation temperature, the heat contained in the exhaust gas is transported to the thermoelectric conversion element through the heat pipe. Accordingly, the heat contained in the exhaust gas is transferred to the catalyst until warming-up of the catalyst is completed. After warming-up of the catalyst is completed, excess heat can be transferred to the thermoelectric conversion element through the heat pipe. With such a simple configuration, warming-up of the catalyst can be completed early, and the electric power generation efficiency of the thermoelectric conversion element can be improved.

According to a third aspect of the invention, an exhaust heat recovery system includes an exhaust pipe in which exhaust gas discharged from an internal combustion engine flows; a catalyst which purifies the exhaust gas; a heat recovery portion which is fitted to the exhaust pipe, and which recovers heat contained in the exhaust gas; a thermoelectric conversion element which generates electric power using thermoelectric conversion; and a heat pipe which connects the heat recovery portion to the catalyst, and which transfers the heat recovered in the heat recovery portion to the catalyst. In the exhaust heat recovery system, an operation starting temperature of the heat pipe is set so as to be equal to or lower than an activation temperature of the catalyst.

With the aforementioned configuration, when the temperature of the exhaust gas is equal to or lower than the activation temperature of the catalyst, the heat recovered in the heat recovery portion is transported to the catalyst through the heat pipe. With such a simple configuration, warming-up of the catalyst can be completed early, and the electric power generation efficiency of the thermoelectric conversion element can be improved. Also, when the temperature of the exhaust gas is higher than the activation temperature of the catalyst, the heat recovered in the catalyst can be transported to the heat recovery portion through the heat pipe. Accordingly, it is possible to prevent the catalyst from being deteriorated due to high temperature.

According to a fourth aspect of the invention, an exhaust heat recovery system includes an exhaust pipe in which exhaust gas discharged from an internal combustion engine flows; a catalyst which purifies the exhaust gas; a heat recovery portion which is fitted to the exhaust pipe; a thermoelectric conversion element which generates electric power using thermoelectric conversion; and a heat pipe which connects the heat recovery portion to the thermoelectric conversion element, and extends through the catalyst, and which transfers heat recovered in the heat recovery portion to the catalyst and the thermoelectric conversion element. In the exhaust heat recovery system, an operation starting temperature of the heat pipe is set so as to be equal to or lower than an activation temperature of the catalyst, and the heat recovered in the heat recovery portion is transported to the catalyst, and then to the thermoelectric conversion element through the heat pipe.

With this configuration, even when the temperature of the exhaust gas is equal to or lower than the activation temperature of the catalyst, the heat contained in the exhaust gas can be transported to the catalyst through the heat pipe. Therefore, warming-up of the catalyst can be completed early. Also, the heat contained in the exhaust gas can be transported to the thermoelectric conversion element. Therefore, warming-up of the catalyst can be completed early and the electric power generation efficiency of the thermoelectric conversion element can be improved in the apparatus having a simple configuration, without providing a control device or the like.

In the exhaust heat recovery system according to each of the first to fourth aspects of the invention, the electric power generation efficiency of the thermoelectric conversion element can be improved without using a complicated device, and warming-up of the catalyst can be completed early in the apparatus having a simple configuration.

BRIEF DESCRIPTION OF THE DRAWINGS

The above mentioned embodiment and other embodiments, objects, features, advantages, technical and industrial significance of this invention will be better understood by reading the following detailed description of the exemplary embodiments of the invention, when considered in connection with the accompanying drawings, in which.

DETAILED DESCRIPTION OF THE PREFERRED EMBODIMENTS

Figure 1:
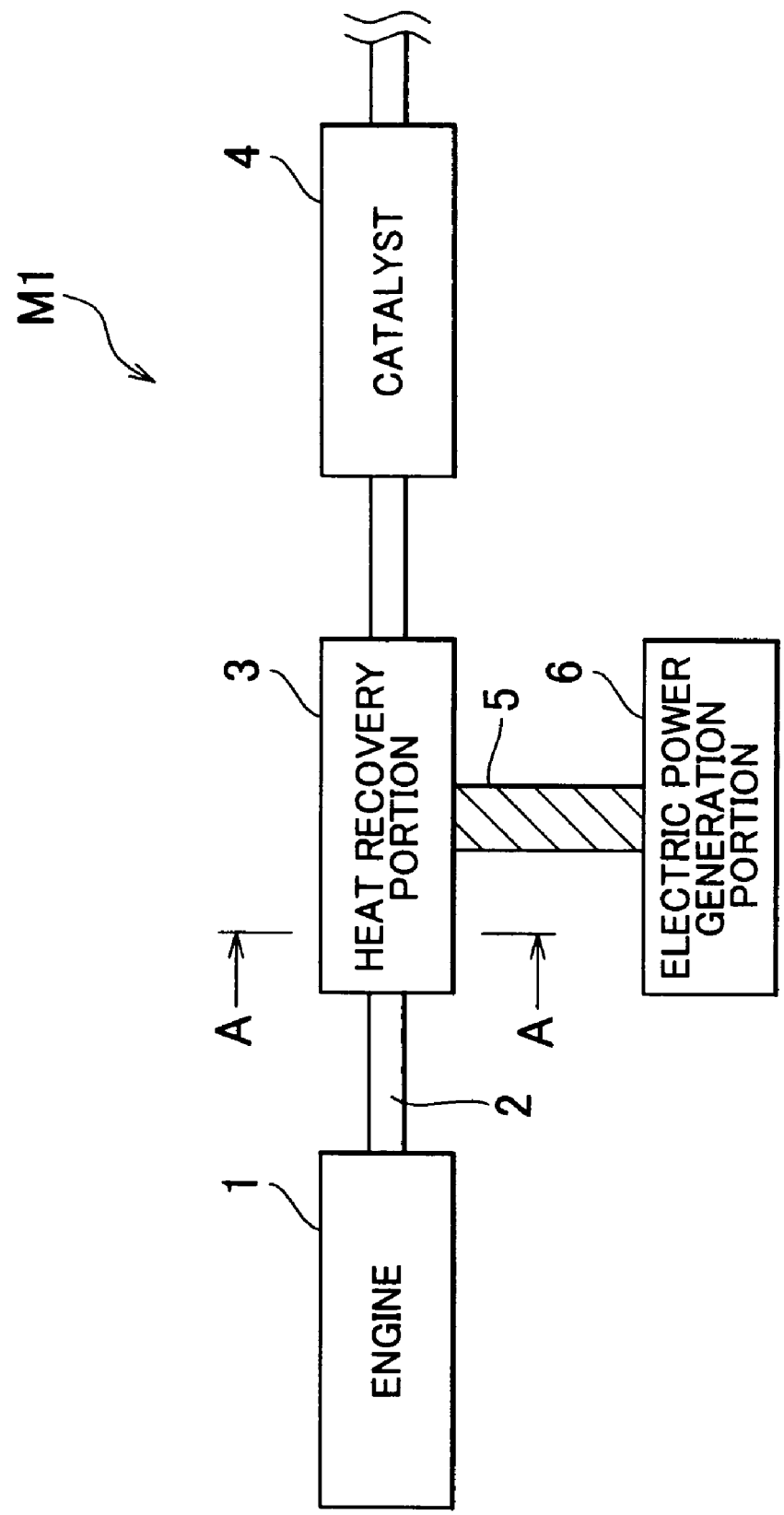
FIG. 1 is a diagram showing a configuration of an exhaust heat recovery system according to a first embodiment of the invention.

In the following description, the present invention will be described in more detail in terms of exemplary embodiments.

Hereinafter, exemplary embodiments of the invention will be described with reference to the drawings. The same elements are denoted by the same reference numerals, and duplicate description thereof may be omitted. First, a first embodiment of the invention will be described.

Figure 2:
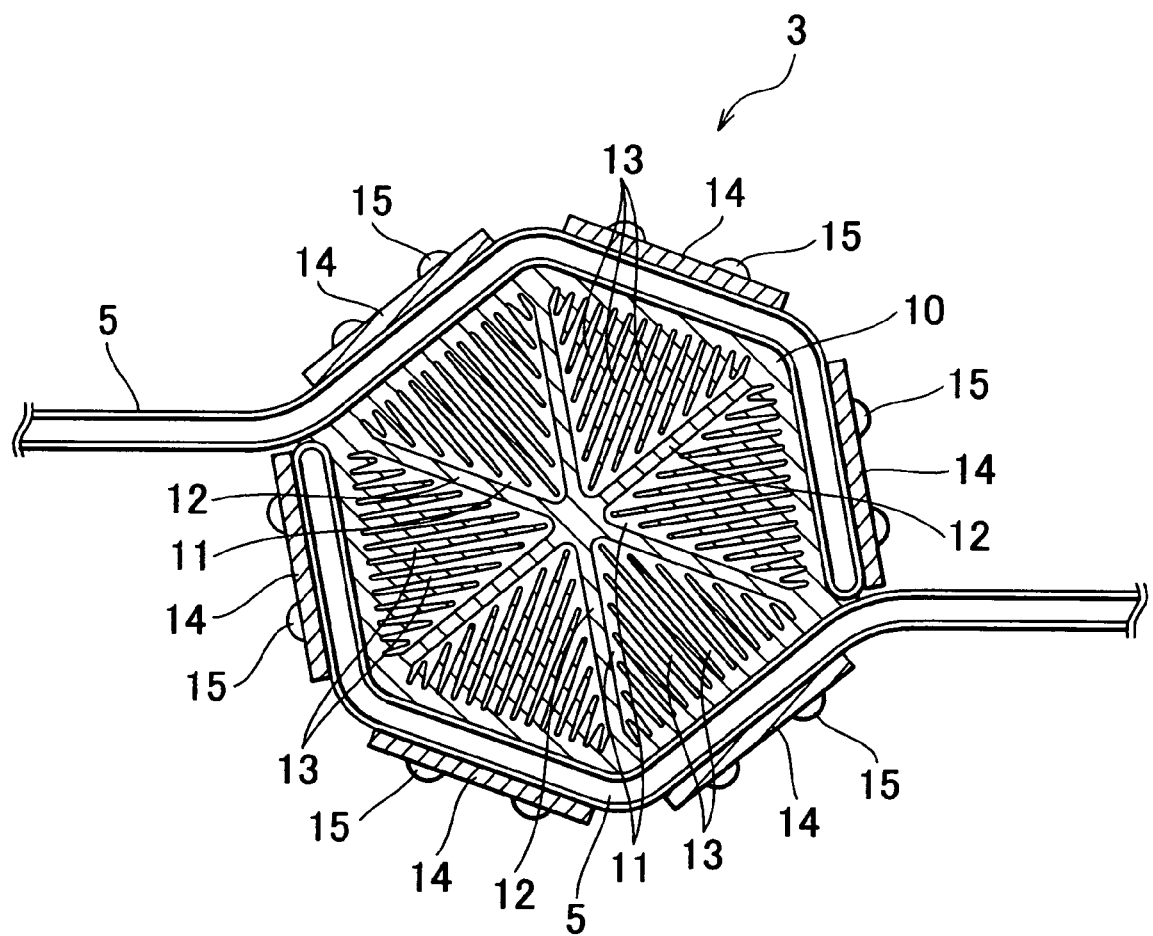
FIG. 2 is a cross sectional view taken along line A—A in FIG. 1.
Figure 3:
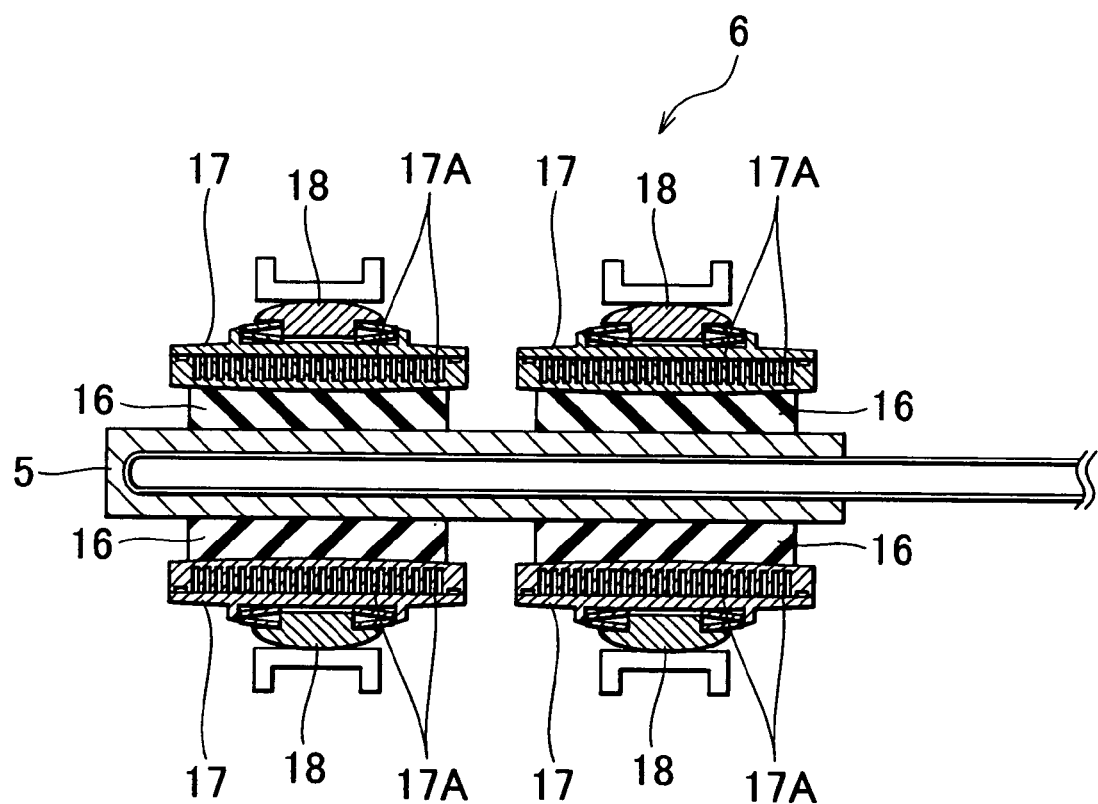
FIG. 3 is a cross sectional view of an electric power generation portion.

FIG. 1 is a diagram showing a configuration of an exhaust heat recovery system according to a first embodiment of the invention. FIG. 2 is a cross sectional view taken along line A—A in FIG. 1. FIG. 3 is a cross sectional view of an electric power generation portion.

As shown in FIG. 1, an exhaust heat recovery system MI according to the first embodiment includes an engine 1 which is an internal combustion engine serving as a heat source, and an exhaust pipe 2 which is connected to a muffler (not shown). Exhaust gas discharged from the engine 1 flows in the exhaust pipe 2. A heat recovery portion 3 and a catalyst 4 are provided in the exhaust pipe 2. The heat recovery portion 3 and the catalyst 4 are provided in this order from the upstream side to the downstream side in the direction in which the exhaust gas flows. The heat pipe 5 is connected to the heat recovery portion 3 at one end portion, and is connected to the electric power generation portion 6 at the other end portion.

As shown in FIG. 2, the heat recovery portion 3 includes an enclosure 10. An exhaust gas passage 11 is formed in a central portion of the enclosure 10. The exhaust gas passage 1 is divided into six sections by support members 12. In the enclosure 10, heat recovery fins 13 are provided so as to protrude in a direction of the exhaust gas passage 11. The heat recovery fins 13 absorb heat contained in the exhaust gas flowing in the exhaust gas passage 11.

Further, the plural heat pipes 5 are fitted to the enclosure 10 at an outer periphery portion. The plural heat pipes 5 are fitted to the enclosure 10 by fastening heat pipe fitting portions 14 by bolts 15. Each of the two heat pipes 5 is provided so as to surround a half of the outer periphery of the exhaust gas passage 11. The plural heat pipes 5 are provided at intervals in the direction in which the exhaust gas flows.

As the catalyst 4, a so-called three-way catalyst is used. The catalyst 4 removes substances such as nitrogen oxide, carbon monoxide, and hydrocarbon. This catalyst 4 is housed in a case (not shown). The exhaust gas flowing through the case is purified by the catalyst 4. The activation temperature of the catalyst 4 varies depending on a material of the catalyst 4 and the like. For example, the activation temperature of the catalyst 4 is in a range of 300° C. to 400° C.

Each heat pipe 5 is connected to the heat recovery portion 3 at one end portion, and is connected to the electric power generation portion 6 at the other end portion. A heating medium is housed in the heat pipe 5. An operation starting temperature of the heating medium at which operation of the heating medium is started is higher than an activation temperature of the catalyst 4. Since such a heating medium is used, heat is transported from the heat recovery portion 3 to the electric power generation portion 6 at a temperature higher than the activation temperature of the catalyst 4. The operation starting temperature of the heat pipe 5 can be set according to type of the heating medium, internal pressure, and the like. For example, when cesium is used as the heating medium, the operation starting temperature of the heat pipe 5 can be set to 450° C. to 900° C. When potassium is used as the heating medium, the operation starting temperature of the heat pipe 5 can be set to 500° C. to 1000° C. When sodium is used as the heating medium, the operation starting temperature of the heat pipe 5 can be set to 600° C. to 1200° C.

As shown in FIG. 3, plural thermoelectric conversion modules 16 and module cooling portions 17 corresponding to the thermoelectric conversion modules 16 are provided in the electric power generation portion 6. The plural thermoelectric conversion modules 16 are provided at intervals in a longitudinal direction of the heat pipe 5, and are in contact with the other end portion of each heat pipe 5. Each thermoelectric conversion module 16 converts heat energy to electric energy using a so-called Seebeck effect.

One surface side of each thermoelectric conversion module 16 is in contact with the heat pipe 5. Each module cooling portion 17 is in contact with the other surface side of the thermoelectric conversion module 16, which is the surface opposite to the surface which is in contact with the heat pipe 5. A coolant passage 17A is formed in the module cooling portion 17. The coolant passage 17A is connected to a coolant flow pipe (not shown). Since coolant is circulated and supplied to the coolant passage 17A from the coolant flow pipe, the other surface side of the thermoelectric conversion module is cooled.

The one surface side of the thermoelectric conversion module 16 is heated by heat transferred from the heat recovery portion 3 through the heat pipe 5. Thus, the temperature of the one surface side of the thermoelectric conversion module 16 and the temperature of the other surface side thereof become different from each other. Accordingly, electric power is generated using thermoelectric conversion in the thermoelectric conversion module 16.

A disc spring 18 is provided on a surface of each module cooling portion 17, which is opposite to a surface which is in contact with the thermoelectric conversion module 16. The module cooling portion 17 is pressed against the thermoelectric conversion module 16 by urging force of the disc spring 18. Thus, the other surface side of the thermoelectric conversion module 16 is cooled by the module cooling portion 17.

Description will be made of operations and effects of the exhaust heat recovery system having the aforementioned configuration according to the embodiment of the invention.

In the exhaust heat recovery system M1 according to this embodiment, when operation of the engine 1 is started, exhaust gas is discharged from the engine 1 to the exhaust pipe 2. The exhaust gas discharged from the engine 1 flows in the exhaust pipe 2, passes through the heat recovery portion 3 and the catalyst 4, and is discharged through the muffler (not shown) to the outside of a vehicle.

After the exhaust gas flows in the exhaust pipe 2 and flows into the heat recovery portion 3, the exhaust gas flows in the exhaust gas passage 11 in the heat recovery portion 3. At this time, when each heat pipe 5 is operated, heat is recovered from the exhaust gas flowing in the exhaust gas passage 11 by the heat recovery fins 13. The heat recovery portion 3 is provided upstream of the catalyst 4 in the direction in which the exhaust gas flows. Therefore, when each heat pipe 5 is operated, the heat contained in the exhaust gas can be transported to the thermoelectric conversion modules 16 in the electric power generation portion 6 without being removed by the catalyst 4. Accordingly, it is possible to increase the amount of electric power generated by the thermoelectric conversion modules 16.

In this embodiment, the operation starting temperature of the heat pipe 5 is higher than the activation temperature of the catalyst 4. The catalyst 4 cannot offer purification performance fully until the temperature of the catalyst 4 reaches the activation temperature or higher. Therefore, when the catalyst 4 has not been sufficiently warmed up, for example, when the engine 1 is started, it is preferable to use the heat contained in the exhaust gas for warming-up of the catalyst 4, instead of using the heat contained in the exhaust gas for electric power generation by the thermoelectric conversion modules 16.

In the exhaust heat recovery system M1 according to this embodiment, since the thermoelectric conversion modules 16 are not fitted to the exhaust pipe 2, heat is not transferred to the thermoelectric conversion modules 16 through the exhaust pipe 2. Also, the operation starting temperature of each heat pipe 5 fitted to the heat recovery portion 3 is set to a temperature higher than the catalyst activation temperature. Thus, when warming-up of the catalyst 4 has not been completed, ordinarily warming-up of the engine 1 has not been completed either, and the temperature of the exhaust gas discharged from the engine 1 is low.

Thus, in a case where the temperature of the exhaust gas is low and is equal to or lower than the catalyst activation temperature, each heat pipe 5 is not operated, and heat is not recovered in the heat recovery portion 3. Accordingly, since heat contained in the exhaust gas discharged from the engine 1 can be transferred to the catalyst 4, warming-up of the catalyst 4 can be completed early.

Also, in a case where warming-up of the catalyst 4 and warming-up of the engine 1 have been completed, and the temperature of the exhaust gas is high, and is higher than the catalyst activation temperature, each heat pipe 5 is operated. At this time, heat recovered from the exhaust gas by the heat recovery fins 13 in the heat recovery portion 3 is transferred to the one surface side of each thermoelectric conversion module 16 through each heat pipe 5.

Further, on the other surface side of each thermoelectric conversion module 16, the coolant is circulated and supplied to the module cooling portion 17. Thus, the temperature on the one surface side of the thermoelectric conversion module 16 and the temperature on the other surface side of the thermoelectric conversion module 16 become different from each other. Accordingly, electric power is generated by the thermoelectric conversion module 16.

As described above, in the exhaust heat recovery system M1 according to this embodiment of the invention, the heat recovery portion 3 is fitted to the exhaust pipe 2, and the heat recovered in the heat recovery portion 3 is transported to the thermoelectric conversion modules 16 through the heat pipes 5. Since the heat recovery portion 3 is provided upstream of the catalyst 4 in the direction in which the exhaust gas flows, the heat contained in the exhaust gas can be transferred to the thermoelectric conversion modules 16 without being removed by the catalyst 4 after warming-up of the catalyst 4 is completed. Accordingly, it is possible to increase the amount of electric power generated by the thermoelectric conversion modules 16.

Further, in the exhaust heat recovery system M1 according to this embodiment of the invention, the portion to which the heat contained in the exhaust gas is transferred is changed between the catalyst 4 and the thermoelectric conversion modules 16 by appropriately setting the operation starting temperature of the heat pipe 5. Therefore, it is not necessary to provide a control device, ON-OFF switching means, or a temperature sensor for detecting the temperature of the catalyst 4. Accordingly, it is possible to simplify the configuration of the exhaust heat recovery system.

Figure 4:
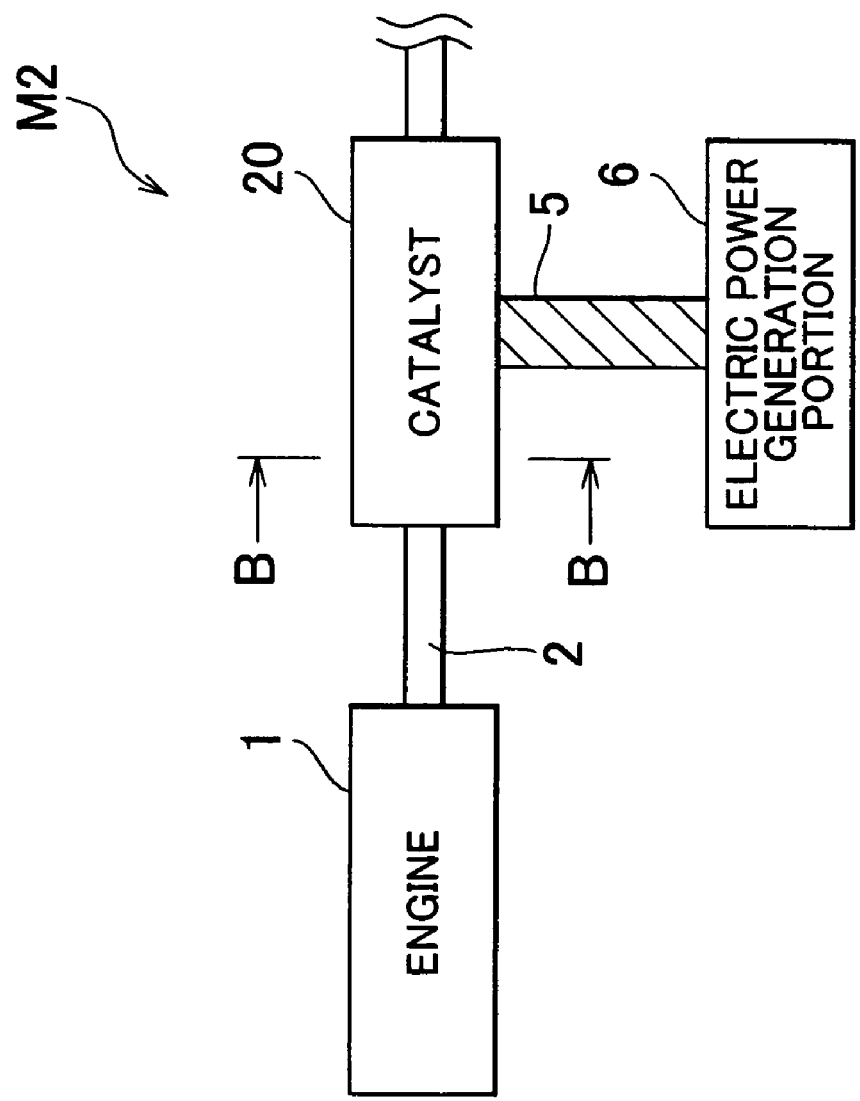
FIG. 4 is a diagram showing a configuration of an exhaust heat recovery system according to a second embodiment of the invention.
Figure 5:
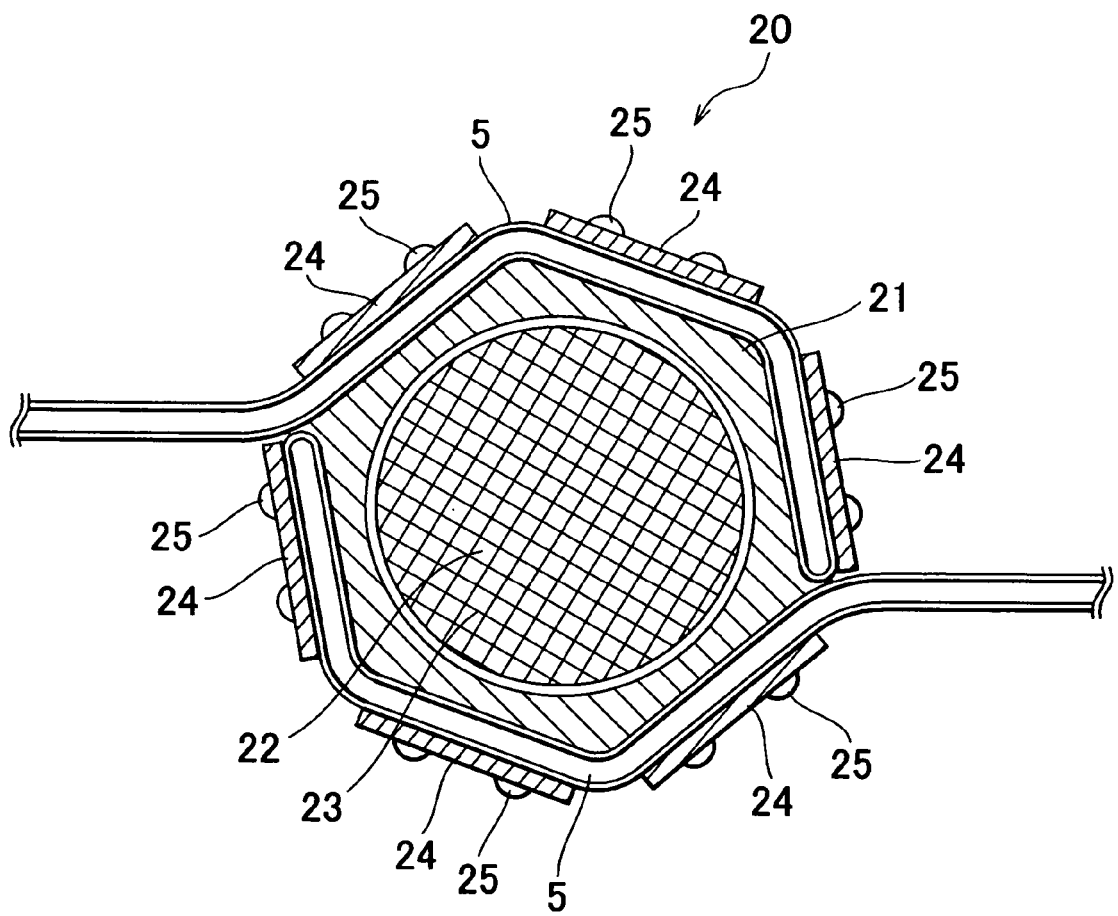
FIG. 5 is a cross sectional view taken along line B—B in FIG. 4.

Next, a second embodiment of the invention will be described. FIG. 4 is a diagram showing a configuration of an exhaust heat recovery system according to a second embodiment of the invention. FIG. 5 is a cross sectional view taken along line B—B in FIG. 4.

As shown in FIG. 4, an exhaust heat recovery system M2 according to this embodiment includes the engine 1 and the exhaust pipe 2 which is connected to the muffler (not shown). The exhaust gas discharged from the engine 1 flows in the exhaust pipe 2. A catalyst 20 is provided in the exhaust pipe 2. Each heat pipe 5 is connected to the catalyst 20 at one end portion, and is connected to the electric power generation portion 6 at the other end portion.

As shown in FIG. 5, the catalyst 20 includes a case 21. An exhaust gas passage 22 which is connected to the exhaust pipe 2 is formed in a center portion of the case 21. A catalyst main body 23 fitted to the case 21 is provided in the exhaust gas passage 22. As the catalyst main body 23, a so-called three way catalyst is used as in the aforementioned first embodiment. The catalyst main body 23 removes substances such as such as nitrogen oxide, carbon monoxide, and hydrocarbon.

Further, the heat pipes 5 are fitted to the case 21 at an outer periphery portion. The heat pipes 5 are fitted to the case 21 by fastening the heat pipe fitting portions 24 by bolts 25. Each of the two heat pipes 5 is provided so as to surround a half of the outer periphery of the exhaust gas passage 22. The plural heat pipes 5 are provided at intervals in the direction in which the exhaust gas flows. The heat contained in the exhaust gas flowing in the exhaust gas passage 22 is transferred to the case 21 through the catalyst main body 23. After the heat is transferred to the case 21, the heat is transferred to the electric power generation portion 6 through the heat pipes 5.

An operation starting temperature of each heat pipe 5 is set so as to be substantially equal to an activation temperature of the catalyst main body 23. Also, the electric power generation portion 6 has the same configuration as in the first embodiment shown in FIG. 3. Thus, the thermoelectric conversion modules 16, the module cooling portions 17, and the like are provided in the electric power generation portion 6.

Description will be made of operations and effects of the exhaust heat recovery system having the aforementioned configuration according to this embodiment of the invention.

In the exhaust heat recovery system M2 according to this embodiment, when the operation of the engine 1 is started, exhaust gas is discharged from the engine 1 to the exhaust pipe 2. The exhaust gas discharged from the engine 1 flows in the exhaust pipe 2, passes through the catalyst 20, and is discharged through the muffler (not shown) to the outside of the vehicle.

After the exhaust gas flows in the exhaust pipe 2 and flows into the catalyst 20, the exhaust gas flows in the exhaust gas passage 22 in the catalyst 20. Since the catalyst main body 23 is provided in the exhaust gas passage 22, the heat contained in the exhaust gas flowing in the exhaust gas passage 22 is transferred to the catalyst main body 23.

Also, each heat pipe 5 is connected to the catalyst 20. When each heat pipe 5 is operated, the heat transported to the catalyst main body 23 is transferred to each heat pipe 5 through the case 21. Further, this heat is transported to one surface side of each thermoelectric conversion module 16 through each heat pipe 5.

The operation starting temperature of each heat pipe 5 is set so as to be substantially equal to the activation temperature of the catalyst main body 23. Therefore, each heat pipe 5 is not operated, and the heat contained in the exhaust gas is transferred to the catalyst main body 23 until the temperature of the catalyst main body 23 reaches the activation temperature. Since the catalyst main body 23 can offer the intrinsic purification performance when the temperature of the catalyst main body 23 reaches the activation temperature, the heat contained in the exhaust gas is transferred to the catalyst main body 23 until the temperature of the catalyst main body 23 reaches the activation temperature. Thus, warming-up of the catalyst main body 23 can be completed early.

After the temperature of the catalyst main body 23 reaches the activation temperature, each heat pipe 5 is operated. When each heat pipe 5 is operated, the heat transferred to the catalyst main body 23 is transported to the thermoelectric conversion modules 16 in the electric power generation portion 6 through the case 21 and each heat pipe 5. Accordingly, after warming-up of the catalyst main body 23 is completed, a large amount of heat can be transferred to the thermoelectric conversion modules 16. Therefore, it is possible to increase the amount of electric power generated by the thermoelectric conversion modules 16.

Further, in the exhaust heat recovery system M2 according to this embodiment of the invention, the portion to which the heat contained in the exhaust gas is transferred is changed between the catalyst main body 23 and the thermoelectric conversion modules 16 by appropriately setting the operation starting temperature of the heat pipe 5. Therefore, it is not necessary to provide a control device, ON-OFF switching means, or a temperature sensor for detecting the temperature of the catalyst 4. Accordingly, it is possible to simplify the configuration of the exhaust heat recovery system.

Figure 6:
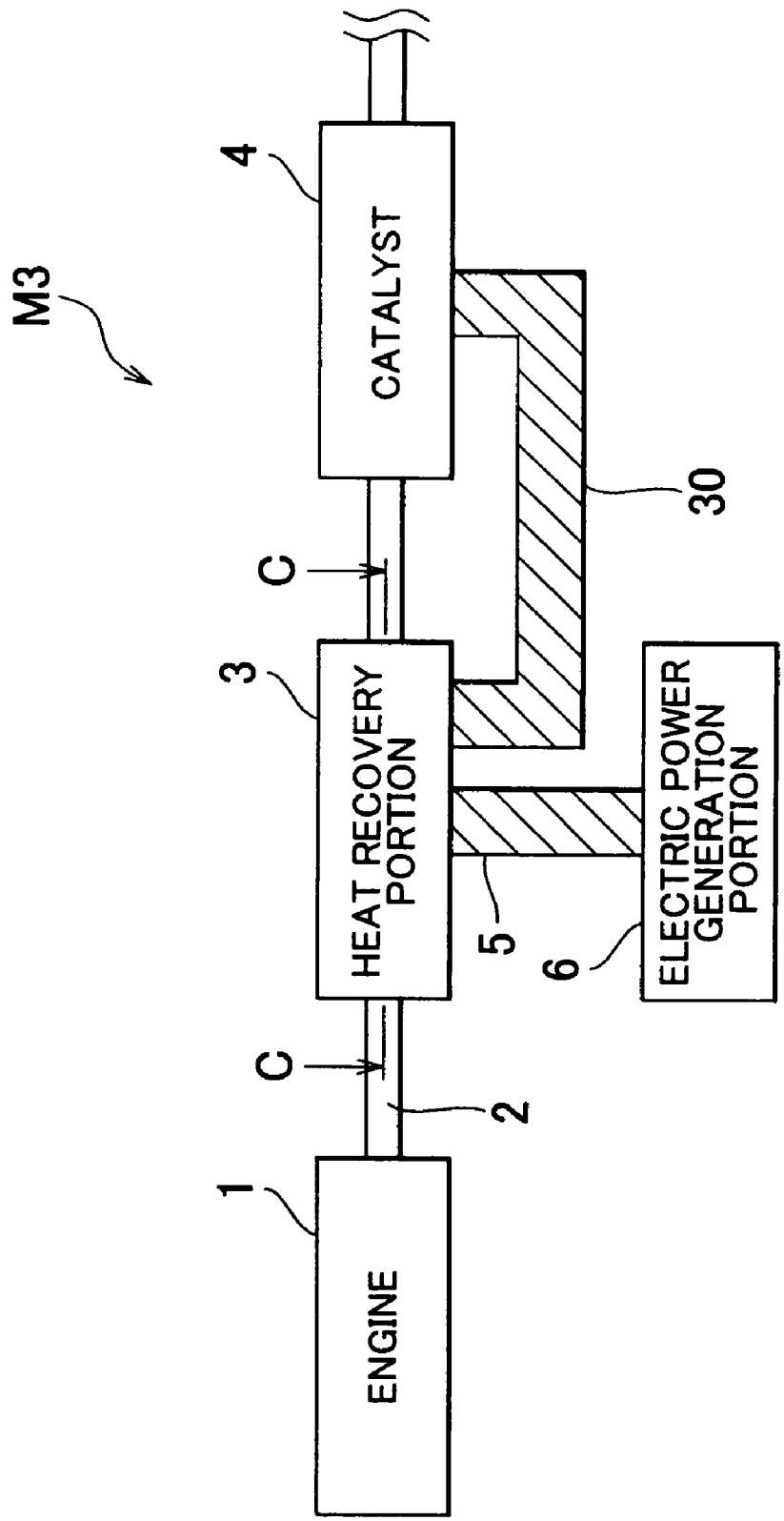
FIG. 6 is a diagram showing a configuration of an exhaust heat recovery system according to a third embodiment of the invention.
Figure 7:
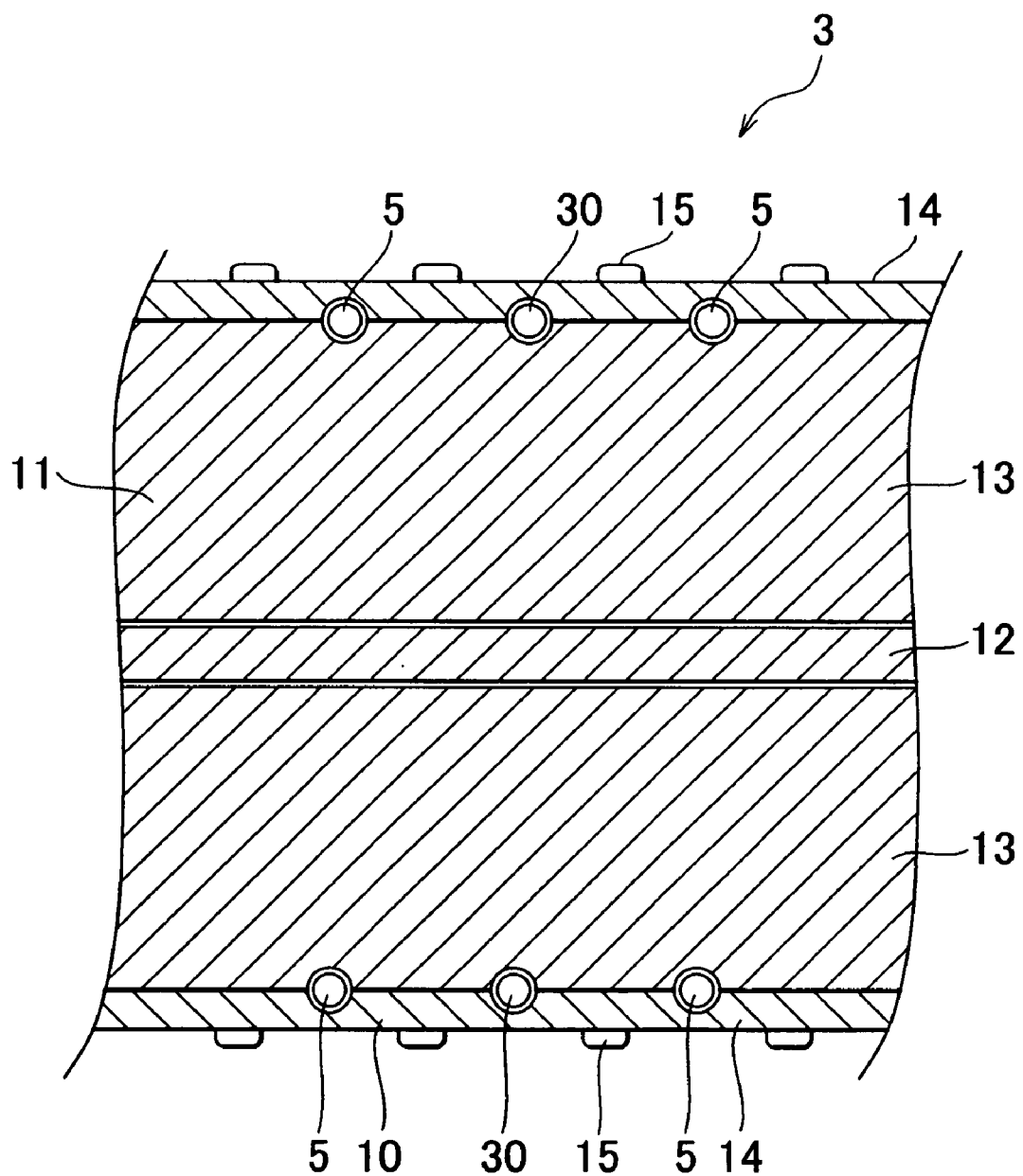
FIG. 7 is a cross sectional view taken along line C—C in FIG. 6.

Subsequently, a third embodiment of the invention will be described. FIG. 6 is a diagram showing a configuration of an exhaust heat recovery system according to a third embodiment of the invention. FIG. 7 is a cross sectional view taken along line C—C in FIG. 6.

As shown in FIG. 6, the exhaust heat recovery system M3 according to this embodiment includes the engine 1 and the exhaust pipe 2 connected to the muffler (not shown). Exhaust gas discharged from the engine 1 flows in the exhaust pipe 2. The heat recovery portion 3 and the catalyst 4 are provided in the exhaust pipe 2. The heat recovery portion 3 and the catalyst 4 are provided in this order from the upstream side to the downstream side in the direction in which the exhaust gas flows.

A first heat pipe 5 is connected to the heat recovery portion 3 at one end portion, and is connected to the electric power generation portion 6 at the other end portion. Further, a second pipe 30 is connected to the heat recovery portion 3 at one end portion, and is connected to an outer surface portion of the catalyst 4 at the other end portion. An operation starting temperature of the first heat pipe 5 is set so as to be higher than the activation temperature of the catalyst 4 as in the aforementioned first embodiment. Meanwhile, an operation starting temperature of the second heat pipe 30 is set so as to be lower than the activation temperature of the catalyst 4. Also, an operation temperature of the second heat pipe 30 at which the second heat pipe 30 is operated is set so as to be substantially equal to the operation starting temperature of the first heat pipe 5. Therefore, when the temperature of the exhaust gas reaches the operation temperature of the first heat pipe 5, the heating medium in the second heat pipe 30 is dried out so that heat cannot be transported.

As shown in FIG. 7, the plural first heat pipes 5 and the plural second heat pipes 30 are fitted to the enclosure 10 through the heat pipe fitting members 14. The first heat pipes 5 and the second heat pipes 30 are alternately provided at intervals in the direction in which the exhaust gas flows.

In the exhaust heat recovery system M3 having the aforementioned configuration according to this embodiment, when the operation of the engine 1 is started, exhaust gas is discharged from the engine 1 to the exhaust pipe 2. The exhaust gas discharged from the engine 1 flows in the exhaust pipe 2, passes through the heat recovery portion 3 and the catalyst 4, and is discharged through the muffler (not shown) to the outside of the vehicle.

After the exhaust gas flows in the exhaust pipe 2, and flows into the heat recovery portion 3, the exhaust gas flows in the exhaust gas passage 11 in the heat recovery portion 3. At this time, the operation states of the first heat pipes 5 and the second heat pipes 30 vary depending on the temperature of the exhaust gas. When warming-up of the engine 1 has not been completed, the temperature of the exhaust gas flowing in the exhaust pipe 2 is low. When warming-up of the engine 1 has not been completed, ordinarily, warming-up of the catalyst 4 has not been completed either. In the case where the temperature of the exhaust gas flowing in the exhaust pipe 2 is low, and is equal to or lower than the activation temperature of the catalyst 4, the first heat pipes 5 are not operated, and the second heat pipes 30 are operated.

Figure 8A:
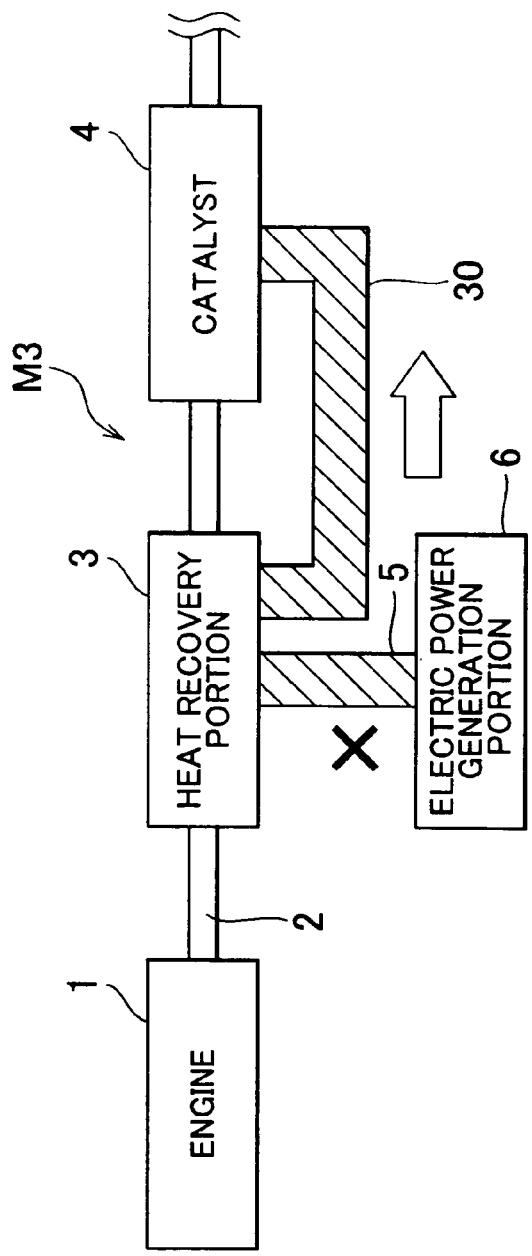
FIG. 8A is a diagram showing a flow of heat in the exhaust heat recovery system while warming-up is performed.

When the second heat pipes 30 are operated, the heat recovered from the exhaust gas by the heat recovery fins 13 in the heat recovery portion 3 is transported to the outer surface of the catalyst 4, and is not transported to the electric power generation portion 6, as shown in FIG. 8A. Thus, since the heat recovered by the heat recovery portion 3 is transported to the catalyst 4, the catalyst 4 is warmed up from the outside. Although a certain amount of heat is recovered in the heat recovery portion 3, the exhaust gas containing remaining heat flows to the catalyst 4. Therefore, the catalyst 4 is warmed up also from the inside. Thus, since the catalyst 4 is warmed up from both of the outside and the inside, warming-up of the catalyst 4 can be completed early.

Also, after warming-up of the engine 1 is completed, the high-temperature exhaust gas flows in the exhaust pipe 2. When warming-up of the engine 1 has been completed, ordinarily, warming-up of the catalyst 4 has been completed. In the case where the temperature of the exhaust gas flowing in the exhaust pipe 2 is high, and is higher than the activation temperature of the catalyst 4, the first heat pipes 5 are operated. Meanwhile, since the heating medium is dried out in the second heat pipes 30, heat is not transported through the second heat pipes 30, and the second heat pipes 30 are not operated.

Figure 8B:
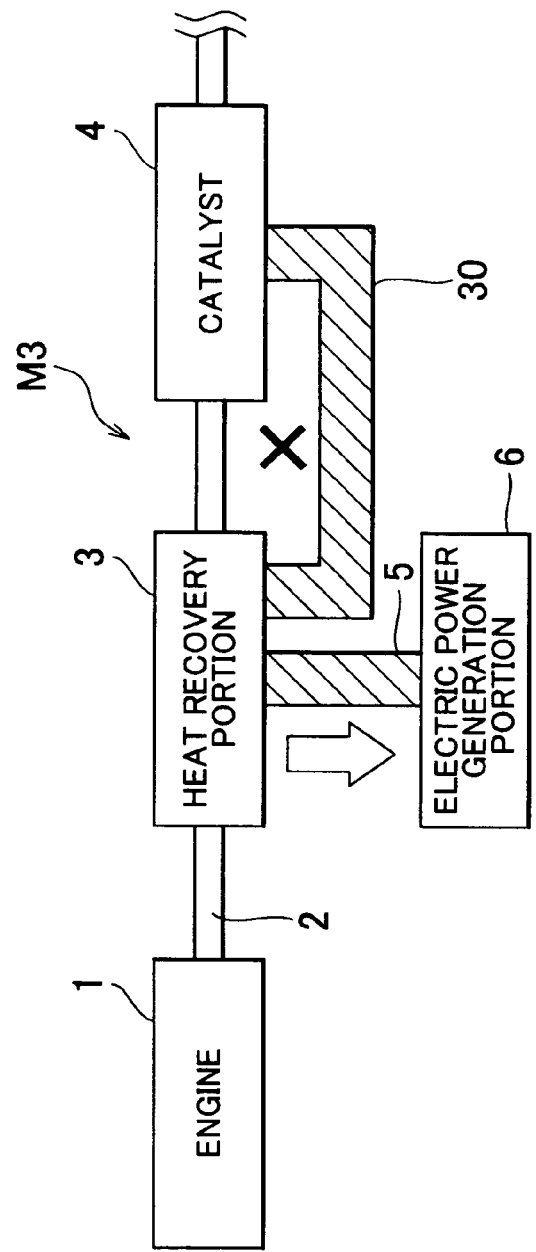
FIG. 8B is a diagram showing a flow of heat in the exhaust heat recovery system after warming-up is completed.

When each first heat pipe 5 is operated, the heat recovered from the exhaust gas by the heat recovery fins 13 in the heat recovery portion 3 is transported to the one surface side of each thermoelectric conversion module 16 in the electric power generation portion 6, and is not transported to the catalyst 4, as shown in FIG. 8B.

Thus, since two types of heat pipes 5 and 30 whose operation starting temperatures are different from each other are used, it is possible to change the portion to which the heat recovered in the heat recovery portion 3 is transported, according to the temperature of the exhaust gas, that is, according to the warming-up states of the engine 1 and the catalyst 4. More specifically, when the temperature of the exhaust gas is equal to or lower than the activation temperature of the catalyst 4, the heat recovered by the heat recovery portion 3 is transported to the catalyst 4. Meanwhile, when the temperature of the exhaust gas is higher than the activation temperature of the catalyst 4, the heat recovered in the heat recovery portion 3 is transported to the one surface side of each thermoelectric conversion module 16.

Accordingly, when warming-up of the catalyst 4 has not been completed, a large amount of heat can be transported to the catalyst 4. Therefore, warming-up of the catalyst 4 can be completed early. Also, after warming-up of the catalyst 4 is completed, a large amount of heat can be transported to the thermoelectric conversion modules 16. Accordingly, it is possible to increase the amount of generated electric power.

Further, in the exhaust heat recovery system M3 according to this embodiment of the invention, the portion to which the heat contained in the exhaust gas is transported is changed between the catalyst 4 and the thermoelectric conversion modules 16 by using the two types of heat pipes whose operation starting temperatures are different from each other. Therefore, it is not necessary to provide a control device, ON-OFF switching means, or a temperature sensor for detecting the temperature of the catalyst 4. Accordingly, it is possible to simplify the configuration of the exhaust heat recovery system.

Figure 9:
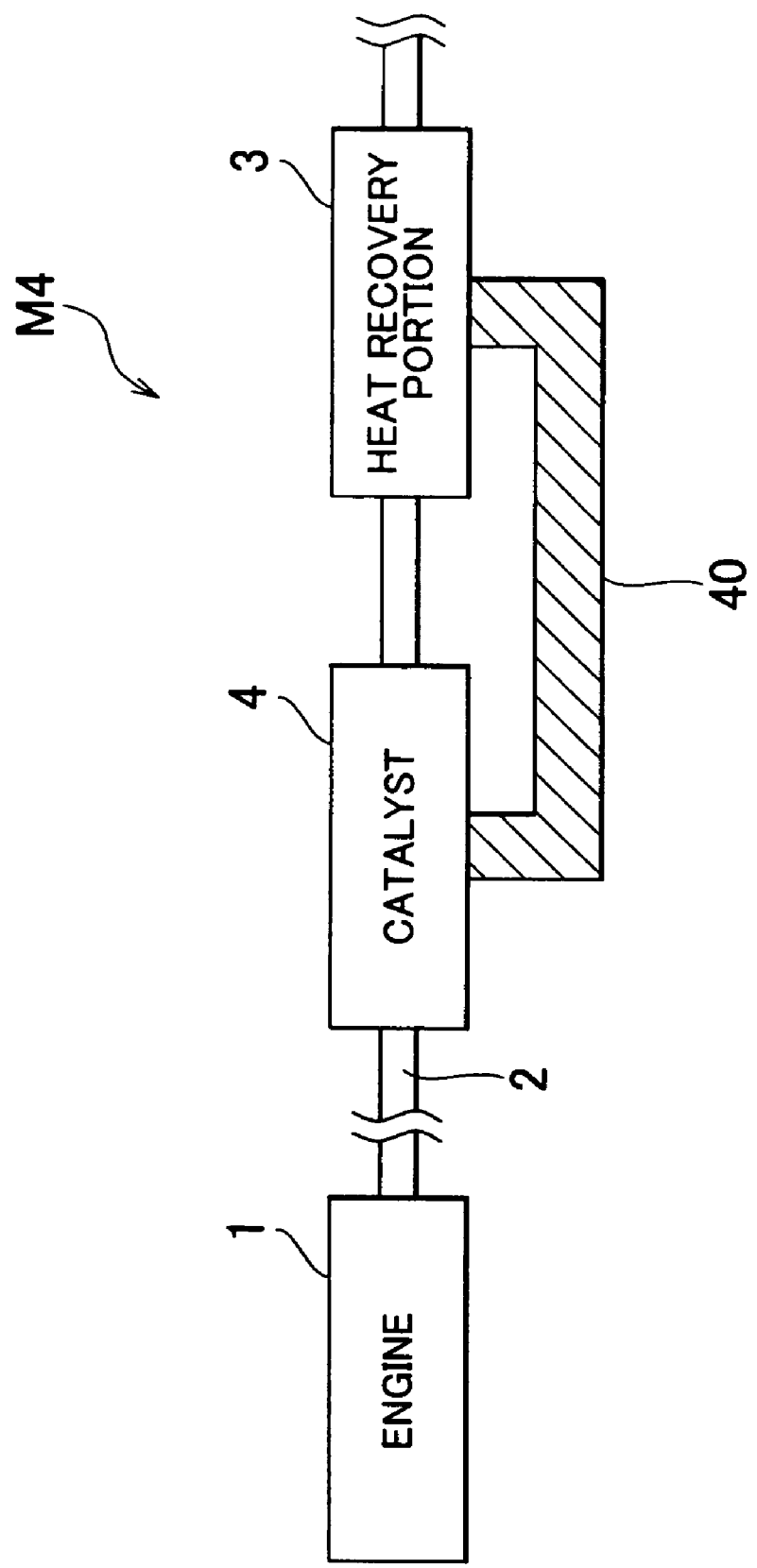
FIG. 9 is a diagram showing a configuration of an exhaust heat recovery system according to a fourth embodiment of the invention.

Subsequently, a fourth embodiment of the invention will be described. FIG. 9 is a diagram showing a configuration of an exhaust heat recovery system according to the fourth embodiment of the invention.

As shown in FIG. 9, the exhaust heat recovery system M4 according to this embodiment includes the engine 1 and the exhaust pipe 2 connected to the muffler (not shown). Exhaust gas discharged from the engine 1 flows in the exhaust pipe 2. The heat recovery portion 3 and the catalyst 4 are provided in the exhaust pipe 2. The catalyst 4 and the heat recovery portion 3 are provided in this order from the upstream side to the downstream side in the direction in which the exhaust gas flows.

A heat pipe 40 is connected to the heat recovery portion 3 at one end portion, and is connected to the catalyst 4 at the other end portion. The operation starting temperature of the heat pipe 40 is set to be in a wide range with the activation temperature of the catalyst 4 being at the center of the range.

In the exhaust heat recovery system M4 having the aforementioned configuration according to this embodiment, when the operation of the engine 1 is started, exhaust gas is discharged from the engine 1 to the exhaust pipe 2. The exhaust gas discharged from the engine 1 flows in the exhaust pipe 2, passes through the catalyst 4 and the heat recovery portion 3, and is discharged through the muffler (not shown) to the outside of the vehicle.

In the case where warming-up of the engine 1 and warming-up of the catalyst 4 have not been completed, after the exhaust gas flows in the exhaust pipe 2 and flows into the catalyst 4, the exhaust gas is used for warming-up of the catalyst 4, and then is discharged to a downstream side. Although the heat contained in the exhaust gas is recovered in the catalyst 4, the heat contained in the exhaust gas cannot be completely recovered in the catalyst 4. Meanwhile, in the exhaust heat recovery system M4 according to this embodiment, the heat recovery portion 3 is provided downstream of the catalyst 4.

Heat is still contained in the exhaust gas discharged from the catalyst 4. The remaining heat in the exhaust gas is recovered in the heat recovery portion 3 provided downstream of the catalyst 4. The heat pipe 40 is provided between the heat recovery portion 3 and the catalyst 4 so as to connect the heat recovery portion 3 to the catalyst 4. Therefore, the heat recovered in the heat recovery portion 3 can be transported to the catalyst 4. Thus, the heat that has not recovered from the exhaust gas in the catalyst 4, that is, the remaining heat in the exhaust gas discharged from the catalyst 4 is recovered in the heat recovery portion 3, and then is transported to the catalyst 4 through the heat pipe 40, whereby warming-up of the catalyst 4 can be completed early.

After warming-up of the engine 1 and warming-up of the catalyst 4 are completed, the exhaust gas containing a large amount of heat flows into the exhaust pipe 2. Since warming-up of the catalyst 4 has been completed at this time, the temperature at the outside of the catalyst 4 and the temperature at the inside of the catalyst 4 have become nearly the same. The exhaust gas containing a large amount of heat flows into the catalyst 4 from the exhaust pipe 2. However, since warming-up of the catalyst 4 has been completed at this time, if a large amount of heat is transported to the catalyst 4, the catalyst may be deteriorated due to high temperature.

In the exhaust heat recovery system M4 according to this embodiment, the heat pipe 40 is provided between the catalyst 4 and the heat recovery portion 3 so as to connect the catalyst 4 to the heat recovery portion 3. Since the temperature at the inside of the catalyst 4 and the temperature at the outside of the catalyst 4 have become nearly the same, the temperature of the catalyst 4 has become higher than the temperature of the heat recovery portion 3. Therefore, excess heat transported to the catalyst 4 can be transported to the heat recovery portion 3 using the heat pipe 40. Thus, since the excess heat can be transported to the heat recovery portion 3, it is possible to prevent the catalyst 4 from being deteriorated due to high temperature.

In the fourth embodiment of the invention, the thermoelectric conversion 0module is not provided. However, for example, the thermoelectric conversion module may be provided downstream of the heat recovery portion 3 in the exhaust pipe 2 in the direction in which the exhaust gas flows.

In this case, the thermoelectric conversion module does not generate electric power until warming-up of the catalyst 4 is completed. Therefore, electric power generation by the thermoelectric conversion module does not prevent warming-up of the catalyst 4 from being completed early. Further, after warming-up of the catalyst 4 is completed, the heat transported to the heat recovery portion 3 from the catalyst 4 through the heat pipe 40 can be used for electric power generation performed by the thermoelectric conversion module. Also, the same effect can be obtained by connecting the thermoelectric conversion module to the heat recovery portion 3 through the heat pipe whose operation starting temperature is higher than the activation temperature of the catalyst 4.

Figure 10A:
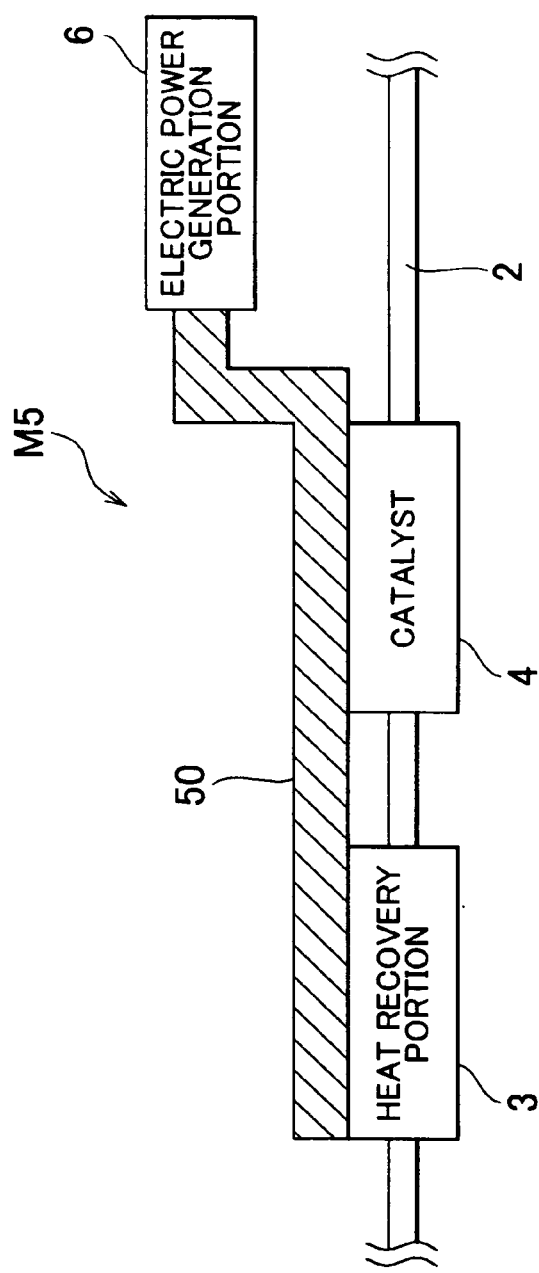
FIG. 10A and FIG. 10B are diagrams each showing a configuration of an exhaust heat recovery system according to a fifth embodiment of the invention.
Figure 10B:
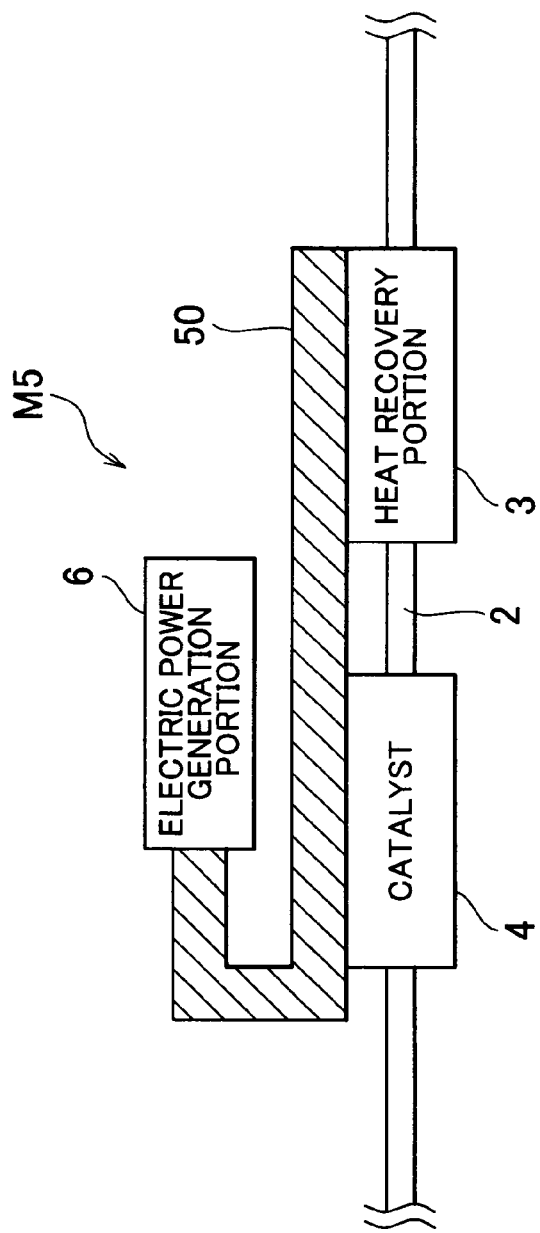

Next, a fifth embodiment of the invention will be described. FIG. 10A and FIG. 10B are diagrams each showing an exhaust heat recovery system according to the fifth embodiment of the invention.

As shown in FIG. 10A, the exhaust heat recovery system M5 according to this embodiment includes the engine 1 and the exhaust pipe 2 connected to the muffler (not shown). Exhaust gas discharged from the engine 1 flows in the exhaust pipe 2. The heat recovery portion 3 and the catalyst 4 are provided in the exhaust pipe 2. The heat recovery portion 3 and the catalyst 4 are provided in the exhaust pipe 2 in this order from the upstream side to the downstream side in the direction in which the exhaust gas flows.

A heat pipe 50 is connected to the heat recovery portion 3 at one end portion, and is connected to the electric power generation portion 6 at the other end portion. Also, the heat pipe 50 is provided so as to extend through the catalyst 4. The operation starting temperature of the heat pipe 50 is equal to or lower than the activation temperature of the catalyst 4. When the temperature of the heat pipe 50 becomes higher than the activation temperature of the catalyst 4, the heating medium cannot be liquefied at the catalyst 4, and the heat cannot be transported to the catalyst 4.

In the exhaust heat recovery system M5 having the aforementioned configuration according to this embodiment, when the operation of the engine 1 is started, the exhaust gas is discharged to the exhaust pipe 2 from the engine 1. The exhaust gas discharged from the engine 1 flows in the exhaust pipe 2, passes through the heat recovery portion 3 and the catalyst 4, and is discharged from the muffler (not shown).

After the exhaust gas flows in the exhaust pipe 2, and flows into the heat recovery portion 3, the heat contained in the exhaust gas is recovered in the heat recovery portion 3. The heat recovered in the heat recovery portion 3 is transported to the catalyst 4 and the electric power generation portion 6 through the heat pipe 50. The heat transported to the catalyst 4 through the heat pipe 50 is transported to the catalyst 4 before the temperature of the catalyst 4 reaches the activation temperature. Warming-up of the catalyst 4 is promoted by the heat transported from the heat recovery portion 3 through the heat pipe 50. Thus, warming-up of the catalyst 4 can be completed early.

After warming-up of the engine 1 and warming-up of the catalyst 4 are completed, and the temperature of the exhaust gas becomes high, the heating medium in the heat pipe 50 cannot be liquefied at the catalyst 4. Accordingly, the heat recovered in the heat recovery portion 3 passes through the catalyst 4, and is transported to the electric power generation portion 6. The heating medium is liquefied at the electric power generation portion 6. Thus, the heat is transported to the electric power generation portion 6, and the heat is transferred to the one surface side of each thermoelectric conversion module 16 in the electric power generation portion 6, whereby the electric power generation efficiency of the thermoelectric conversion module 16 is improved.

Thus, in the exhaust heat recovery system M5 according to this embodiment, the heat recovered in the heat recovery portion 3 is transported to the catalyst 4 until warming-up of the catalyst 4 is completed. Meanwhile, after warming-up of the catalyst 4 is completed, the heat is transported to the thermoelectric conversion modules 16. Accordingly, warming-up of the catalyst 4 can be completed early, and the electric power generation efficiency of the thermoelectric conversion module 16 can be improved.

Further, in this embodiment, the heat recovery portion 3 is provided upstream of the catalyst 4 in the direction in which the exhaust gas flows. As shown in FIG. 10B, the heat recovery portion 3 may be provided downstream of the catalyst 4 in the direction in which the exhaust gas flows. In this case, the heat recovery portion for the electric power generation portion 6 and the heat recovery portion for warming-up of the catalyst 4 can be integrally provided, instead of separately providing the heat recovery portion for the electric power generation portion 6 and the heat recovery portion for warming-up of the catalyst 4.

While the invention has been described with reference to exemplary embodiments thereof, it is to be understood that the invention is not limited to the exemplary embodiments or constructions. To the contrary, the invention is intended to cover various modifications and equivalent arrangements. In addition, while the various elements of the exemplary embodiments are shown in various combinations and configurations, which are exemplary, other combinations and configurations, including more, less or only a single element, are also within the spirit and scope of the invention.

What is claimed is:

1. An exhaust heat recovery system comprising:
an exhaust pipe in which exhaust gas discharged from an internal combustion engine flows;
a catalyst which purifies the exhaust gas;
a heat recovery portion which is fitted to the exhaust pipe, and which recovers heat contained in the exhaust gas;
an electric power generation portion which generates electric power using thermoelectric conversion; and
a heat pipe which connects the heat recovery portion to the electric power generation portion, and which transfers the heat from the exhaust gas recovered in the heat recovery portion to the electric power generation portion via the heat pipe, wherein an operation starting temperature of the heat pipe for heat transfer via the heat pipe is set so as to be higher than an activation temperature of the catalyst.

2. The exhaust heat recovery system according to claim 1, further comprising:
a second heat pipe which connects the heat recovery portion to the catalyst, and which transfers the heat recovered in the heat recovery portion to the catalyst, wherein an operation starting temperature of the second heat pipe is set so as to be equal to or lower than an activation temperature of the catalyst.

3. An exhaust heat recovery system comprising:
an electric power generation portion which generates electric power using thermoelectric conversion;
a catalyst which purifies exhaust gas discharged from an internal combustion engine; and
a heat pipe which connects the catalyst to the electric power generation portion, and which transfers heat from the exhaust gas recovered in the catalyst to the electric power generation portion, wherein an operation starting temperature of the heat pipe for heat transfer via the heat pipe is set so as to be substantially equal to an activation temperature of the catalyst.

4. An exhaust heat recovery system comprising:
an exhaust pipe in which exhaust gas discharged from an internal combustion engine flows;
a catalyst which purifies the exhaust gas;
a heat recovery portion which is fitted to the exhaust pipe, and which recovers heat contained in the exhaust gas;
an electric power generation portion which generates electric power using thermoelectric conversion; and
a heat pipe which connects the heat recovery portion to the catalyst, and which transfers the heat from the exhaust gas recovered in the heat recovery portion to the catalyst, wherein an operation starting temperature of the heat pipe for heat transfer via the heat pine is set so as to be equal to or lower than an activation temperature of the catalyst.

5. An exhaust heat recovery system comprising:
an exhaust pipe in which exhaust gas discharged from an internal combustion engine flows;
a catalyst which purifies the exhaust gas;
a heat recovery portion which is fitted to the exhaust pipe;
an electric power generation portion which generates electric power using thermoelectric conversion; and
a heat pipe which connects the heat recovery portion to the electric power generation portion, and extends through the catalyst, and which transfers heat from the exhaust gas recovered in the heat recovery portion to the catalyst and the electric power generation portion, wherein an operation starting temperature of the heat pipe for heat transfer via the heat pipe is set so as to be equal to or lower than an activation temperature of the catalyst, and the heat recovered in the heat recovery portion is transported to the catalyst, and then to the electric power generation portion through the heat pipe.

6. The exhaust heat recovery system according to claim 1, further comprising:
a thermoelectric conversion module in contact with the heat pipe for generating electric power when heat is transferred through the heat pipe to the electric power generation portion.

7. The exhaust heat recovery system according to claim 3, further comprising:
a thermoelectric conversion module in contact with the heat pipe for generating electric power when heat is transferred through the heat pipe to the electric power generation portion.

8. The exhaust heat recovery system according to claim 4, further comprising:

a thermoelectric conversion module in contact with the heat pipe for generating electric power when heat is transferred through the heat pipe to the electric power generation portion.

9. The exhaust heat recovery system according to claim 5, further comprising:

a thermoelectric conversion module in contact with the heat pipe for generating electric power when heat is transferred through the heat pipe to the electric power generation portion.

* * * * *